United States Patent [19]

Nilsson et al.

[11] Patent Number: 4,564,851

[45] Date of Patent: Jan. 14, 1986

[54] RECORDING DEVICE FUNCTIONING WITH FLUID DROPLETS

[75] Inventors: Kenth Nilsson, Akersberga; Jan Bolmgren, Vaellingby, both of Sweden

[73] Assignee: Siemens Aktiengesellschaft, Berlin & Munich, Fed. Rep. of Germany

[21] Appl. No.: 578,088

[22] Filed: Feb. 8, 1984

[30] Foreign Application Priority Data

Feb. 22, 1983 [DE] Fed. Rep. of Germany ....... 3306101

[51] Int. Cl.⁴ ............................................ G01D 15/18
[52] U.S. Cl. ................... 346/140 R; 310/330
[58] Field of Search ................. 346/140; 310/330, 332

[56] References Cited

U.S. PATENT DOCUMENTS 3,622,815 11/1971 Schafft ................................. 310/332
3,949,247 4/1976 Fenner ................................. 310/332
4,072,959 2/1978 Elmquist ............................. 346/140
4,409,601 10/1983 Nilsson ................................ 346/140
4,438,441 3/1984 Bolmgren ........................... 346/140

Primary Examiner—Joseph W. Hartary
Attorney, Agent, or Firm—Hill, Van Santen, Steadman & Simpson

[57] ABSTRACT

An improved recording device, which has a row of nozzles with each nozzle having an inlet opening and an outlet opening and a piezoelectric transducer arranged adjacent the inlet opening for forcing a drop of recording fluid from the outlet opening onto a recording medium in response to a voltage change on the transducer, characterized by the individual transducers being formed as teeth of a comb-like piezoplate that is a bilaminar plate formed of a piezoceramic layer and a carrier layer and has a reinforcing layer in the area of a spine of the comb which is shared by all teeth of the plate.

14 Claims, 4 Drawing Figures

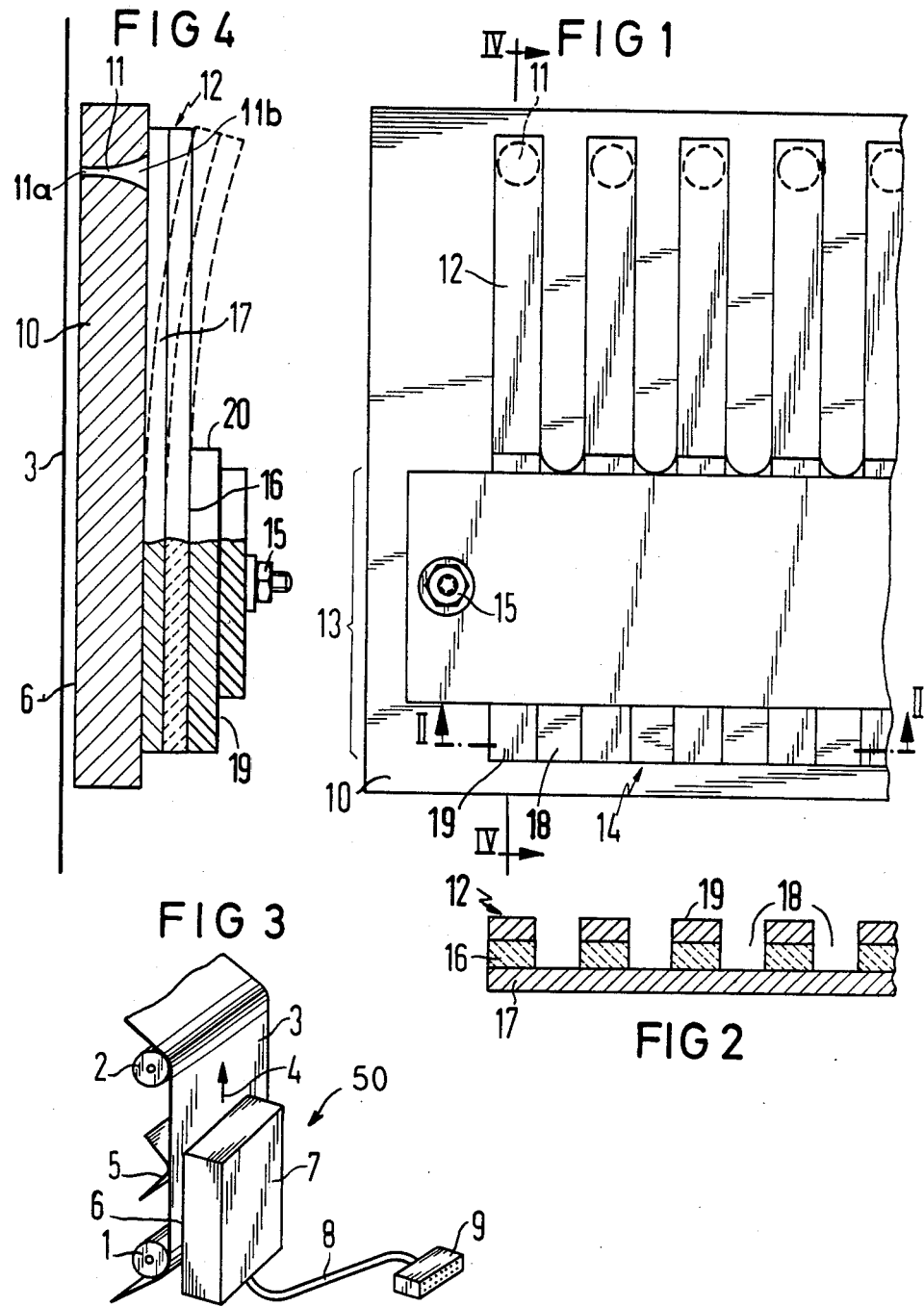

RECORDING DEVICE FUNCTIONING WITH FLUID DROPLETS

BACKGROUND OF THE INVENTION

The present invention is directed to a recording device functioning with fluid droplets for point-by-point recording of analog progressions and/or alphanumerical characters as well as images. The device includes a plurality of nozzles, which have inlet openings and outlet openings and which are arranged in a row with a recording medium being disposed in front of the discharge openings of the nozzles to enable writing individual points on the medium. A piezoelectric transducer is provided in front of the intake openings of the nozzles and each of the transducers are provided with means for applying an electrical voltage so that with a given electrical voltage change the writing fluid is ejected from the particular nozzle. The individual transducers are formed by teeth of a comb-like piezoelectric plate which plate is a bilaminar plate of a piezoelectric ceramic layer and a carrier layer.

A recording device, wherein the plate material consists of a layer of piezoceramic material and a metal layer is disclosed in U.S. Pat. No. 4,072,959, which was based on German No. OS 2,527,647 and whose disclosure is incorporated by reference thereto. In this patent, a piezoplate comprising a layer of piezoceramic material and a carrier layer is disclosed which plate has a comb-like structure with parallelly extending teeth forming the individual transducers. In one embodiment, a spacer piece is provided between a nozzle plate and the comb-like piezoelectric plate. The comb is held in position by means of a clamp that extends over the entire length of the spine of the comb. The problem with this design is that the clamping of the comb in the clamp must occur with extreme precision. Since the thickness of the comb only amounts to a few tenths of a millimeter, a displacement between the spacer piece and the clamp of the same order of magnitude will lead to considerable changes in the flexural forces. The flexural lengths of the transducers in the two twist directions become different as a consequence and this will lead to imprecise writing.

Given the traditional comb fixing, it must also be taken into consideration that the clamp comes into contact with all of the transducers of the comb precisely and with identical force insofar as possible. This is required so that the flexural length of all the transducers will remain identical. This is particularly difficult to achieve in the case of the central transducers of the comb which therefore tend to bend below the clamp.

SUMMARY OF THE INVENTION

The present invention is directed to providing a recording device utilizing a comb-shaped transducer wherein the lengths of the oscillatory parts of the individual transducers are precisely fixed in a simple manner and strain is avoided.

This object is inventively achieved in an improvement for a recording device which utilizes fluid droplets for punctiform recording of analog curves of alphanumerical characters as well as images on a recording medium, said device having nozzles with intake openings and discharge openings disposed in a row for writing the individual points, a piezoelectric transducer being disposed in front of each intake opening of the nozzle and having means for applying electrical voltage so that with an electrical voltage change to a transducer, a writing fluid is ejected from the nozzle and applied to the recording being disposed in front of the discharge opening of the nozzles, said individual transducers being formed by teeth of a comb-like piezoplate which is a bilaminar plate of a layer of piezoceramic material and a carrier layer. The improvements comprise the piezoceramic layer being provided with a reinforcing layer in the area of a spine of the comb which spine is shared by all teeth. Thus, both surfaces of the spine of the piezoceramic plate is provided with a layer which is either a carrier layer or reinforcing layer. The dimension and material of the carrier layer should be selected so that they oppose forces of expansion of the piezoceramic layer upon application of voltage with equal resistance on both surfaces. Thus, the piezoceramic layer will expand in a straight-line fashion in the region of the reinforcing layer and undesirable warping will not occur. Another advantage is that a far simpler arrangement can be utilized as a clamp for the comb without making demands on the tolerances. The precise length of the oscillatory parts of the transducer is defined by the front edge of the reinforcement layer.

Further advantages and details include the fact that the elasticity of the reinforcing layer corresponds to the elasticity of the carrier layer, that the carrier layer and the reinforcing layer are composed of the same material which may be a metal, for example, nickel. In addition, the reinforcing layer and the carrier layer may be composed of non-conductive materials selected from a group consisting of ceramic and glass and, for example, from a group consisting of aluminum oxide and silicon.

BRIEF DESCRIPTION OF THE DRAWINGS

FIG. 1 is a plan view of a comb-like piezoceramic plate in accordance with the present invention;

FIG. 2 is a cross-sectional view of the piezoceramic plate taken along the lines II—II of FIG. 1;

FIG. 3 is a schematic illustration of the recording device of the present invention; and FIG. 4 is a cross-sectional view taken along the lines IV—IV of FIG. 1 with portions in elevation for purposes of illustration.

DESCRIPTION OF THE PREFERRED EMBODIMENTS

The principles of the present invention are particularly useful in a recording device generally indicated at 50 in FIG. 3. The recording device 50 has a pair of conveyor rolls 1 and 2 which convey a recording medium 3, for example, a standard registration paper in a direction 4. As illustrated, the recording medium 3 is drawn over a distancer 5 along a side 6 of a housing 7. The housing 7 has a connecting line 8 which extends to a plug 9 at its free end for connection to a control device (not illustrated) that supplies the control signals for recording desired curves, characters and images on the recording medium 3.

As best illustrated in FIG. 4, the surface or side 6 of the housing 7 extends parallel to the medium 3. The side 6 is the side of a carrier member or plate 10 that exhibits a plurality of nozzles 11 disposed next to one another in a row (best illustrated in FIG. 1). As illustrated in FIG. 4, each of the nozzles 11 has an exit or discharge opening 11a and an entrance or intake opening 11b. The housing 7 in addition to containing writing fluid also has bar-shaped transducers 12 of piezoelectric material that are electrically contacted and arranged so that they will spray writing fluid in the form of a droplet from the exit opening 11a of a nozzle 11 when a selected change in the electrical drive voltage occurs.

The transducers 12 are designed as teeth of a comb (FIG. 1) and function as flexure resonators. The piezocomb 14, which consists of the transducers 12 and the comb spine 13, is thereby disposed parallel to the plane of the carrier 10. It is shown in FIG. 4 that the piezoplate is a bilaminar plate and is formed with a piezoceramic layer 16 and a metal layer 17. The piezoceramic layer 16 is provided with a reinforcing layer 19 (FIG. 1) in the area of the comb spine 13 which is shared with all of the teeth. The position of an edge 20 of the reinforcing layer 19 defines the length of the oscillatory part of the transducers 12. The same material as employed for the carrier layer 17, for example, nickel, is preferably used for the reinforcing layer 19 so that the elasticity of the reinforcing layer corresponds to that of the carrier layer 17. The free end region of the individual transducers 12 is situated in front of the individual nozzle 11 of the row of nozzles. The comb spine 13 is clamped on the carrier 10 by threaded fasteners such as nut and bolt arrangement 15. Given the application of electrical voltage to the connecting means for each of the transducers 12, the transducer will move to a position indicated in broken lines in FIG. 4. Given a short circuit of the transducer 12, it will spring back into its non-bent position indicated with solid lines and thereby forces a droplet of writing fluid through the nozzle 11 and out the opening 11a.

As best illustrated in FIGS. 1 and 2, the ceramic layer 16 in the extension of the tooth interstices 18 is also removed on the comb transverse between the teeth or, respectively, the transducer 12 over the comb traverse 13 shared by all of the teeth 12. FIGS. 1 and 4 are illustrated to scale. The spacing between, for example, each nozzle 11 or respectively between each tooth 12 amounts to approximately 250 um.

Ceramic or glass can be provided instead of metal for the carrier layer 17 as well as for the reinforcing layer 19. Examples of ceramic or glass materials utilized are aluminum oxide and silicon.

Although various minor modifications may be suggested by those versed in the art, it should be understood that we wish to embody within the scope of the patent granted hereon, all such modifications as reasonably and properly come within the scope of our contribution to the art.

We claim:

1. In a recording device functioning with fluid droplets for punctiform recording of analog curves of alphanumerical characters as well as images on a recording medium, said device having nozzles with intake openings and discharge openings disposed in a row for writing the individual points, a piezoelectric transducer for each intake opening, clamp means for positioning a transducer in front of each intake opening of the nozzle, each transducer having means for applying electrical voltage thereto so that when the electric voltage changes on the transducer, a writing fluid is ejected from the nozzle onto a recording medium disposed in front of the discharge openings of the nozzles, each of the individual transducers being formed by teeth of a comb-like piezoplate which is a bilaminar plate of a piezoceramic layer and a carrier layer, the improvements comprising the piezoceramic layer being provided with a reinforcing layer in the area of a comb spine shared by all of the teeth on a surface of the spine opposite the carrier layer, said reinforcing layer having an edge defining a length of an oscillatory part of each transducer.

2. In a recording device according to claim 1, wherein the elasticity of the reinforcing layer corresponds to the elasticity of the carrier layer.

3. In a recording device in accordance with claim 2, wherein the same material is employed for both the carrier layer and for the reinforcing layer.

4. In a recording device according to claim 3, wherein the material utilized for the carrier layer and the reinforcing layer comprises a metal.

5. In a recording device according to claim 4, wherein said metal is nickel.

6. In a recording device according to claim 3, wherein the material is a non-conductive material selected from a group consisting of ceramic and glass.

7. In a recording device according to claim 6, wherein the material is selected from a group consisting of aluminum oxide and silicon.

8. In a recording device according to claim 1, wherein the reinforcing layer and carrier layer each have substantially the same elasticity and are composed of nickel.

9. In a recording device according to claim 1, wherein the reinforcing layer and the carrier layer have substantially the same elasticity and are composed of a non-conductive material selected from a group consisting of ceramic and glass.

10. In a recording device according to claim 9, wherein said non-conductive material is selected from a group consisting of aluminum oxide and silicon.

11. In a recording device according to claim 1, wherein the material of the reinforcing layer is selected from a non-conductive material selected from a group consisting of ceramic and glass.

12. In a recording device according to claim 11, wherein the non-conductive material is selected from a group consisting of aluminum oxide and silicon.

13. In a recording device according to claim 1, wherein the reinforcing layer is formed of a metal.

14. In a recording device according to claim 13, wherein said metal is nickel.

* * * * *